United States Patent
Chyu et al.

(10) Patent No.: US 9,559,265 B2
(45) Date of Patent: Jan. 31, 2017

(54) FLIP-CHIP LED, METHOD FOR MANUFACTURING THE SAME AND FLIP-CHIP PACKAGE OF THE SAME

(71) Applicant: Mao Bang Electronic Co., Ltd., Taoyuan County (TW)

(72) Inventors: Christopher Chyu, Taoyuan County (TW); Ta-Lun Sung, Taoyuan County (TW); Tung-Sheng Lai, Taoyuan County (TW)

(73) Assignee: MAO BANG ELECTRONIC CO., LTD., Taoyuan County (TW)

( * ) Notice: Subject to any disclaimer, the term of this patent is extended or adjusted under 35 U.S.C. 154(b) by 0 days.

(21) Appl. No.: 14/664,037

(22) Filed: Mar. 20, 2015

(65) Prior Publication Data
US 2015/0270448 A1 Sep. 24, 2015

(30) Foreign Application Priority Data
Mar. 21, 2014 (TW) .............................. 103110748 A

(51) Int. Cl.
- *H01L 33/00* (2010.01)
- *H01L 33/46* (2010.01)
- *H01L 33/48* (2010.01)

(52) U.S. Cl.
CPC ........... *H01L 33/46* (2013.01); *H01L 33/0095* (2013.01); *H01L 33/486* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | |
|---|---|---|
| 5,557,115 A | 9/1996 | Shakuda |
| 6,497,944 B1 | 12/2002 | Oku et al. |
| 6,514,782 B1 | 2/2003 | Wierer, Jr. et al. |
| 6,791,119 B2 | 9/2004 | Slater, Jr. et al. |
| 6,914,268 B2 | 7/2005 | Shei et al. |
| 7,087,526 B1 | 8/2006 | Zhuang et al. |
| 7,294,866 B2 | 11/2007 | Liu |
| 7,335,519 B2 | 2/2008 | Shei et al. |
| 7,393,411 B2 | 7/2008 | Ichinose et al. |

(Continued)

FOREIGN PATENT DOCUMENTS

| | | |
|---|---|---|
| TW | 573330 B | 1/2004 |
| TW | M350824 U | 2/2009 |
| TW | I423482 B | 1/2014 |

*Primary Examiner* — Reema Patel
(74) *Attorney, Agent, or Firm* — Muncy, Geissler, Olds & Lowe, P.C.

(57) ABSTRACT

A flip-chip LED, a method for manufacturing the same and a flip-chip LED package are revealed. The LED includes at least one multi-layer reflective layer covered over the outermost layer thereof. The multi-layer reflective layer includes non-conductive reflective layer or combination of the non-conductive reflective layer with conductive reflective layer. The multi-layer reflective layer is manufactured by physical vapor deposition (PVD) with a mask at one time. The mask is used to form a pattern of the multi-layer reflective layer. Thus a photoresist layer is further formed on surface of exposed electrodes. Then a pumping and venting process is used only once during to complete vacuum deposition of each layer of the multi-layer reflective layer in turn.

8 Claims, 5 Drawing Sheets

(56) References Cited

U.S. PATENT DOCUMENTS

| | | |
|---|---|---|
| 7,462,861 B2 | 12/2008 | Slater, Jr. et al. |
| 7,642,121 B2 | 1/2010 | Slater, Jr. et al. |
| 7,713,353 B2 | 5/2010 | Ichinose et al. |
| 7,939,832 B2 | 5/2011 | Colvin et al. |
| 7,985,979 B2 | 7/2011 | David et al. |
| 8,049,230 B2 | 11/2011 | Chan et al. |
| 8,211,722 B2 | 7/2012 | Lu |
| 2002/0163302 A1 | 11/2002 | Nitta et al. |
| 2004/0113156 A1 | 6/2004 | Tamura et al. |
| 2011/0014734 A1 | 1/2011 | Lu |
| 2011/0297914 A1* | 12/2011 | Zheng .................... H01L 33/46 257/13 |

* cited by examiner

FLIP-CHIP LED, METHOD FOR MANUFACTURING THE SAME AND FLIP-CHIP PACKAGE OF THE SAME

BACKGROUND OF THE INVENTION

The present invention relates to a LED, a method for manufacturing the same and a package of the same, especially to a flip-chip LED (light emitting diode), a method for manufacturing the same and a flip-chip package of the same. The flip-chip LED includes at least one multi-layer reflective layer covered over an outer surface of a LED chip except the area with exposed electrodes. The multi-layer reflective layer is produced by physical vapor deposition (PVD) with the same mask at one time.

Refer to TWI423482 (US2011/0014734), TW 573330, TW M350824; U.S. Pat. Nos. 8,211,722, 6,914,268, 8,049, 230, 7,985,979, 7,939,832, 7,713,353, 7,642,121, 7,462,861, 7,393,411, 7,335,519, 7,294,866, 7,087,526, 5,557,115, 6,514,782, 6,497,944, 6,791,119; US2011/0014734, US2002/0163302, and US2004/0113156, techniques related to flip-chip LED such as GaN LED, reflective layer of LED, or flip-chip package of LED are revealed. These prior arts provide different techniques for solving problems of LED chip or LED package such as light emitting efficiency, heat dissipation, service life, cost, yield rate, process simplification, and luminous decay. Take U.S. Pat. No. 8,211,722 and US2011/0014734 (Ser. No. 12/505,991) as an example. The U.S. Pat. No. 8,211,722 is continuation-in-part of the US2011/0014734. Refer to U.S. Pat. No. 8,211,722, a flip-chip GaN LED fabrication method is revealed. The chip includes a substrate, an N-type GaN ohmic contact layer, a light-emitting layer, a P-type semiconductor layer, a translucent conducting layer (such as Indium Tin Oxide), a P-type electrode pad, an N-type electrode pad, isolation protection layers and a metallic reflection layer. The metallic reflection layer is generally produced by physical vapor deposition (PVD). However, if the metal reflection layer includes three layer, three a plurality of different masks is required to form a pattern of the metal reflection layer for arranging photoresist layer thereon. Then multiple times (such as three times) of processes (such as PVD) are carried out to form respective layer on the outer surface of the LED (except the area with the electrodes). For example, if the reflection layer includes three layers, three masks are required to form pattern of the reflection layer and arrange the photoresist layer. Then the vacuum deposition process such as PVD is carried out three times to form a multi-layer reflection layer on the outer surface of the LED chip (except the area with the electrodes) in turn. One mask and one pumping and venting process are required during each PVD process. The plurality of masks required and multiple times of PVD processes required for manufacturing the multi-layer reflection layer increase both time and cost. This has negative effect on mass-production and market competitiveness.

Thus there is room for improvement and a need to provide a novel flip-chip LED, a method for manufacturing the same and a package of the same that overcomes the shortcomings mentioned above.

SUMMARY OF THE INVENTION

Therefore it is a primary object of the present invention to provide a flip-chip LED that is produced by using the same mask at one time for simplifying manufacturing processes, reducing production cost and solving problems of a multi-layer reflective layer in conventional LED produced by several different masks and multiple times of physical vapor deposition (PVD). In order to achieve the above object, a flip-chip LED of the present invention includes a sapphire substrate, an N-type ohmic contact layer, a light emitting layer, a P-type ohmic contact layer, a transparent conductive metal oxide layer, at least two exposed electrodes with different polarities and at least one multi-layer reflective layer covered over the outermost layer. The multi-layer reflective layer includes the non-conductive reflective layer or combination of the non-conductive reflective layer with the conductive reflective layer. The multi-layer reflective layer is formed on the outer surface of the LED (except the outer surface of the LED disposed with exposed electrodes) by physical vapor deposition (PVD) with the same mask at one time. The one-time manufacturing means using a pumping and venting process once during PVD to complete vacuum deposition of each layer of the multi-layer reflective layer in turn.

When the multi-layer reflective layer is formed by a non-conductive silicon dioxide ($SiO_2$) film, a conductive aluminum film and a non-conductive $SiO_2$ film, the multi-layer reflective layer is disposed with an electrode division area and is divided into two separate half reflective layers that are electrically insulated from each other by the electrode division area.

When the multi-layer reflective layer is formed by non-conductive distributed Bragg reflector (DBR), the multi-layer reflective layer is an integrated reflective layer without electrode division area.

It is another object of the present invention to provide a flip-chip LED that includes a conductive reflective layer formed on surface of a multi-layer reflective layer by Physical Vapor Deposition (PVD) with the same mask at one time. The conductive reflective layer is a metal reflective layer in a single-layer or double-layer structure formed by an aluminum film, a silver film or combination of the aluminum film with the silver film. Thus both thermal conductivity and heat dissipation are improved and the design is suitable for high power LED chip or the LED package thereof.

It is a further object of the present invention to provide a method for manufacturing flip-chip LED having following steps. Step 1: provide a wafer having a plurality of LED chips. Each LED chip includes a sapphire substrate, an N-type ohmic contact layer, a light emitting layer, a P-type ohmic contact layer, a transparent conductive metal oxide layer, and two exposed electrodes with different polarities. Step 2: use a mask to form a pattern of a multi-layer reflective layer so that a photoresist layer is disposed on surface of the two exposed electrodes with different polarities respectively. Step 3: form the multi-layer reflective layer on an outer surface of each LED chip by Physical Vapor Deposition (PVD) at one time. The one-time manufacturing means using a pumping and venting process during PVD to complete vacuum deposition of each layer of the multi-layer reflective layer in turn. Step 4: remove the photoresist layer on surface of respective exposed electrode to get a plurality of LED chips.

It is a further object of the present invention to provide a method for manufacturing flip-chip LED further includes the following step besides the above 4 steps. Step 5: form a conductive reflective layer on an outer surface of the multi-layer reflective layer by PVD with the same mask at one time. The conductive reflective layer is a metal reflective layer in a single-layer or double-layer structure formed by an aluminum film, a silver film or double-layer structure or combination of the aluminum film with the silver film so as to increase thermal conductivity or heat dissipation area/ effect. The design is suitable for high power LED chip or the LED package thereof.

It is a further object of the present invention to provide a method for manufacturing flip-chip LED further includes the following steps after the above step 4 or step 5. Step 6: arrange a solder bumping at surface of each exposed electrode. Step 7: form separate LED chips by polishing, laser scribing and breaking, and chip sorting (or photoelectric property testing of chip). Step 8: align and mount the separate LED chip to a LED heat spreader with conductive adhesive in an upside-down manner by die bonding and reflow soldering to complete LED package. The LED heat spreader is used for heat dissipation while the conductive adhesive can be flux, solder paste, etc.

It is a further object of the present invention to provide a method for manufacturing flip-chip LED further includes the following steps after the above step 4 or step 5. Step 6*a*: form separate LED chips by polishing, laser scribing and breaking, and chip sorting (or photoelectric property testing of chip). Step 7*a*: align and mount the separate LED chip to a LED heat spreader with conductive adhesive in an upside-down manner by die bonding and reflow soldering to complete LED package. The LED heat spreader is used for heat dissipation while the conductive adhesive can be flux, solder paste, etc.

It is a further object of the present invention to provide a flip-chip package of flip-chip LED including a flip-chip LED chip and a heat spreader. The flip-chip LED chip includes a sapphire substrate, an N-type ohmic contact layer, a light emitting layer, a P-type ohmic contact layer, a transparent conductive metal oxide layer, at least two exposed electrodes with different polarities and at least one multi-layer reflective layer covered over the outermost layer. The multi-layer reflective layer is formed on the outer surface of the LED chip (except the outer surface of the LED chip disposed with exposed electrodes) by physical vapor deposition (PVD) with the same mask at one time. The one-time manufacturing means using a pumping and venting process once during PVD to form each layer of the multi-layer reflective layer in turn. The LED chip is aligned and mounted to a heat spreader with conductive adhesive (such as flux or solder paste) in an upside-down manner by die bonding and reflow soldering.

DETAILED DESCRIPTION OF THE PREFERRED EMBODIMENTS

Figure 1A:
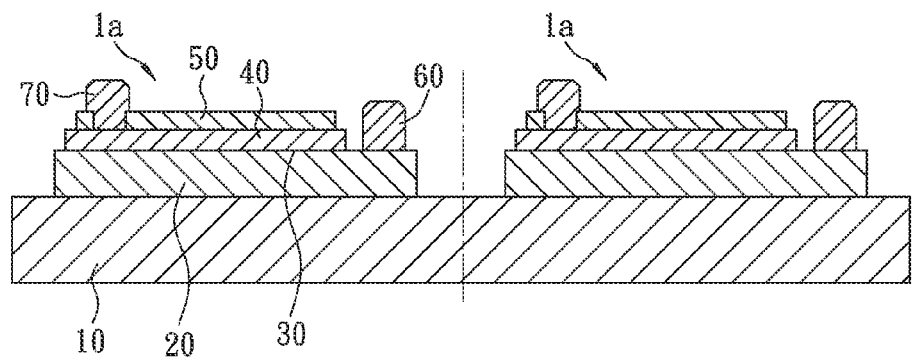
FIG. 1A~1D are schematic drawings showing a flow chart of a method for manufacturing flip-chip LED and structure of the LED according to the present invention.
Figure 1B:
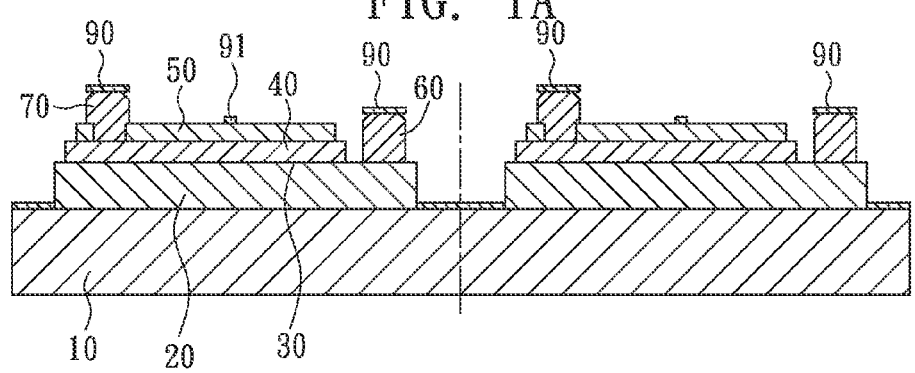
Figure 1C:
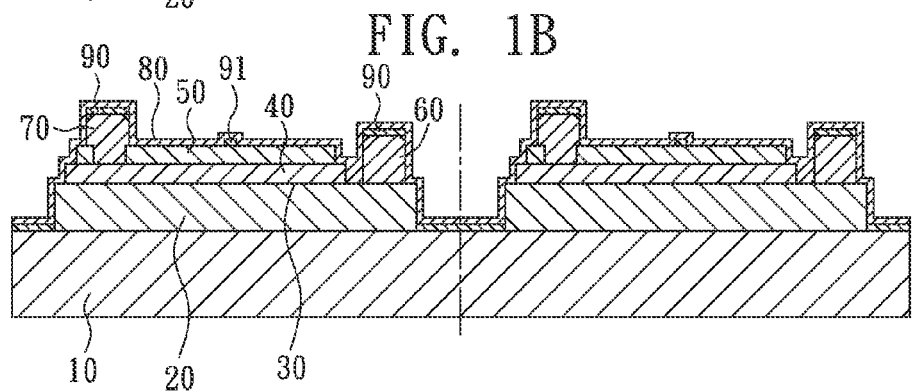
Figure 1D:
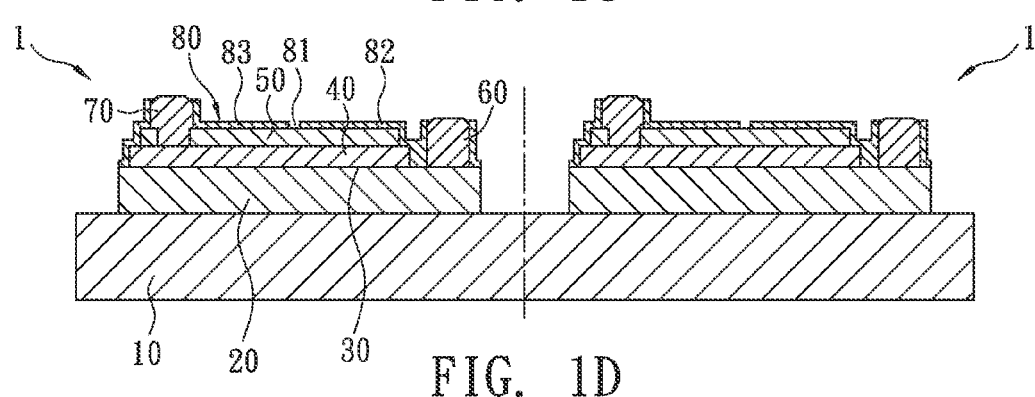

Refer to FIG. 1D, a flip-chip LED 1 of the present invention includes a sapphire substrate 10, an N-type ohmic contact layer 20 formed and disposed on the substrate 10, a light emitting layer 30, a P-type ohmic contact layer 40 formed and arranged at the N-type ohmic contact layer 20, a transparent conductive metal oxide layer 50, two exposed electrodes with different polarities such as a negative electrode 60 and a positive electrode 70 and a multi-layer reflective layer 80 covered over the outermost layer. The light emitting layer 30 is formed at an interface between the N-type ohmic contact layer 20 and the P-type ohmic contact layer 40. The multi-layer reflective layer 80 includes non-conductive reflective layers or combinations of non-conductive reflective layers and conductive reflective layers. The multi-layer reflective layer 80 is formed on an outer surface of the LED 1 except the area occupied by the exposed electrodes 60, 70 and is produced by physical vapor deposition (PVD) with the same mask at one time.

The manufacturing method with the same mask at one time mentioned above means first a pattern of the reflective layer is formed by using the same mask while performing PVD. Thus a photoresist layer 90 is formed on the surface of the exposed electrode parts 60, 70 respectively, as shown in FIG. 1B. Next carry out a pumping and venting process to complete vacuum deposition of each layer of the multi-layer reflective layer 80 in turn so as to simplify manufacturing processes and reduce the cost.

As to the techniques available in the field of vacuum deposition, the technique using a mask to form a pattern of the reflective layer or the technique using a pumping and a venting process once to form a reflective layer is considered as prior art. Yet the present invention that uses the same mask to form the pattern of the reflective layer and then uses the pumping and the venting process again to form each reflective layer of the multi-layer reflective layer in turn is an inventive step in the field. The present invention at least simplifies the manufacturing processes and reduces the production cost by solving the problems of conventional techniques that produce a multi-layer reflective layer by using a plurality of different masks and multiple times of PVD.

Refer to FIG. 1D, the multi-layer reflective layer 80 is formed by a non-conductive silicon dioxide ($SiO_2$) film, a conductive aluminum film and a non-conductive $SiO_2$ film. The conductive aluminum film is located between the non-conductive $SiO_2$ film on an inner side and the non-conductive $SiO_2$ film on an outer side. The multi-layer reflective layer 80 is further disposed with an electrode division area 81 that divides the multi-layer reflective layer 80 into two separate half reflective layers 82, 83 that are electrically insulated from each other and electrically connected the two exposed electrodes 60, 70 respectively. The electrode division area 81 is used to prevent the multi-layer reflective layer 80 from conducting due to the conductive aluminum film.

In another embodiment of the present invention, the multi-layer reflective layer 80 can also be formed by a non-conductive distributed Bragg reflector (DBR) film. The DBR film itself is in a multilayer structure and having a plurality layers of silicon dioxide ($SiO_2$) films and titanium oxide ($Ti_3O_5$) films (such as 16 layers). The multi-layer DBR reflective layer 80 can increase brightness of LED chip. Moreover, due to non-conductive property of the DBR film, there is no need to dispose the electrode division area 81 that separates the multi-layer reflective layer 80 into two electrically-insulating half reflective layers 82, 83.

While performing PVD with the same mask at once as mentioned above, the pattern of the multi-layer reflective layer 80 is formed by the same mask. For example, the photoresist layer 90 and/or the photoresist layer 91 are/is formed by the same mask. Then each layer of the multi-layer reflective layer 80 is formed by the pumping and the venting process of vacuum deposition in turn at one time. The layers of the multi-layer reflective layer 80 can be either a $SiO_2$/aluminum/$SiO_2$ structure or a multi-layer DBR reflective layer having completely non-conductive reflective layers (such as each non-conductive film of DBR film or $SiO_2$ film) or combinations of non-conductive reflective layers (such as $SiO_2$ film) with conductive reflective layers (such as aluminum film).

Refer from FIG. 1A to FIG. 1D, a method for manufacturing flip-chip LED of the present invention includes following steps.

Step 1: provide a wafer 2 having a plurality of LED chips 1a (such as, but not limited to GaN LED) and each LED chip 1a includes a sapphire substrate 10, an N-type ohmic contact layer 20, a light emitting layer 30, a P-type ohmic contact layer 40, a transparent conductive metal oxide layer 50, and two exposed electrodes with different polarities such as a negative electrode 60 and a positive electrode 70, as shown in FIG. 1A.

Step 2: use a mask to form a pattern of a multi-layer reflective layer 80 so that a photoresist layer 90 or 91 is disposed on surface of the two exposed electrodes with different polarities 60, 70, as shown in FIG. 1B.

Step 3: form the multi-layer reflective layer 80 on an outer surface of each LED chip 1a by Physical Vapor Deposition (PVD) at one time, as shown in FIG. 1C. The one-time manufacturing means using a pumping and venting process once during PVD to complete vacuum deposition of each layer of the multi-layer reflective layer 80.

Step 4: remove the photoresist layer 90 or the photoresist layer 91 such as the photoresist layer 90 on surface of the exposed electrodes 60, 70 to get a plurality of LED chips 1 having the multi-layer reflective layer 80, as shown in FIG. 1D.

In the above step 2, a conductive aluminum film and a non-conductive $SiO_2$ film, a photoresist layer 91 is formed on a preset position of the electrode division area 81 of the pattern besides a photoresist layer 90 arranged at the surface of the two exposed electrodes 60, 70 while using the same mask to form the pattern of the multi-layer reflective layer 80 once the multi-layer reflective layer 80 is formed by a non-conductive $SiO_2$ film, as shown in FIG. 1B and FIG. 1C. In the step 4, the photoresist layer 91 on the preset position of the electrode division area 81 is also removed while removing the photoresist layer 90 on surface of the exposed electrodes 60, 70. Thus the electrode division area 81 is formed on the multi-layer reflective layer 80, as shown in FIG. 1D. Thereby the multi-layer reflective layer 80 is divided into two separate half reflective layers 82, 83 by the electrode division area 81. The half reflective layers 82, 83 are electrically insulated from each other and electrically connected the two exposed electrodes 60, 70 respectively.

Moreover, in the step 2, there is no need to arrange the photoresist layer 91 at the pattern of the multi-layer reflective layer 80 while using the same mask to form the pattern of the multi-layer reflective layer 80 once the multi-layer reflective layer 80 is formed by a multi-layer DBR reflective layer (non-conductive reflective layer).

Figure 4A:
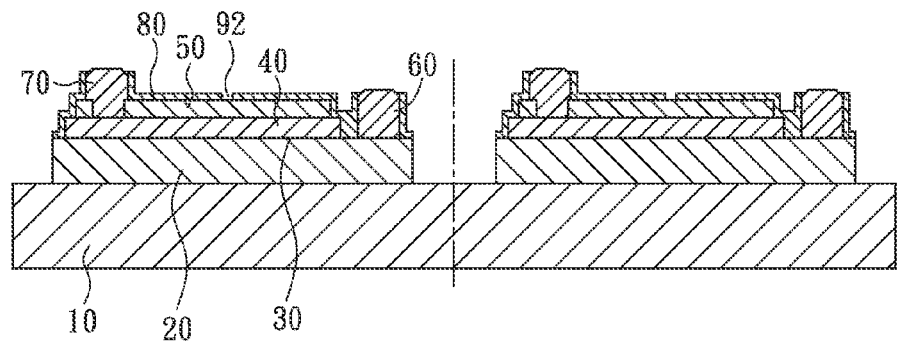
FIG. 4A~4D are schematic drawings showing another flow chart of a method for manufacturing flip-chip LED and structure of the LED according to the present invention.
Figure 4B:
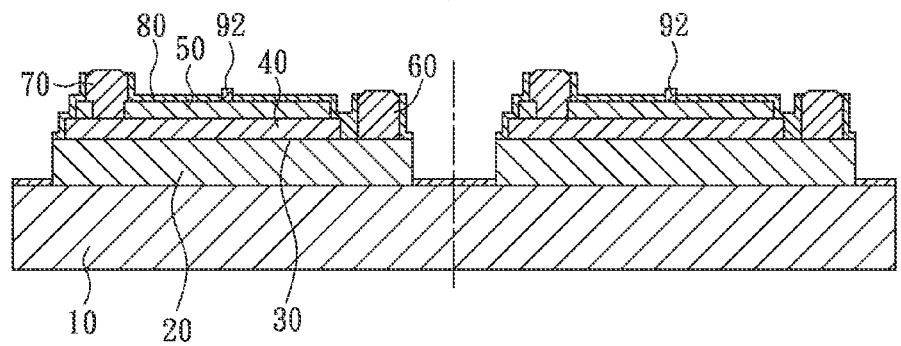
Figure 4C:
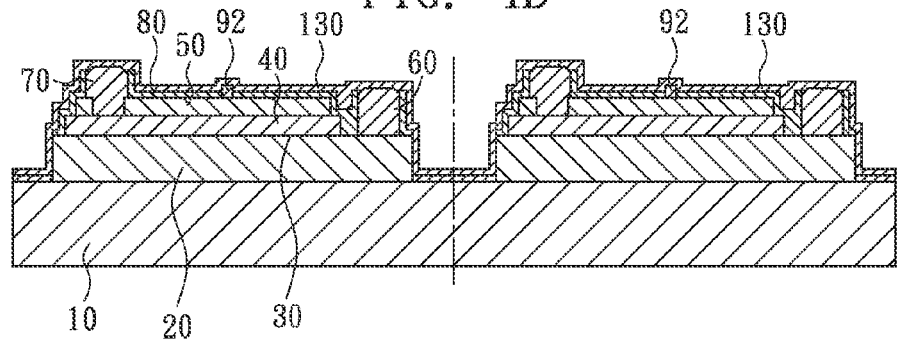
Figure 4D:
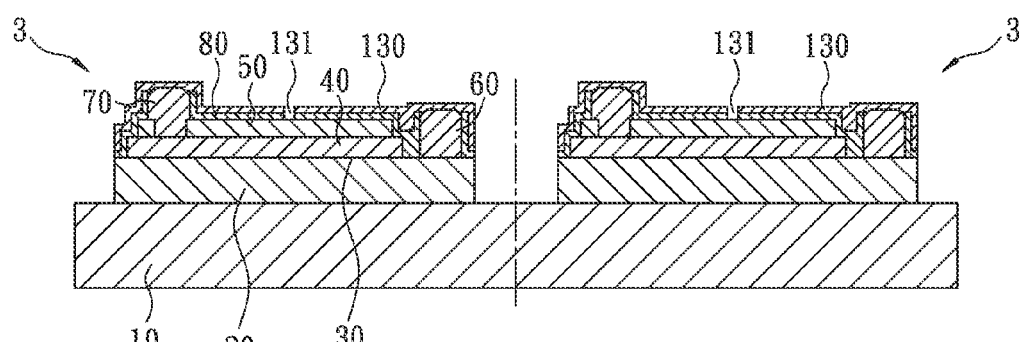

Refer to FIG. 4D, a multi-layer reflective layer 80 of a LED 1 of the present invention is further disposed with a conductive reflective layer 130 by using the same PVD for manufacturing the multi-layer reflective layer 80 with the same mask at one time as mentioned above. The conductive reflective layer 130 is a metal reflective layer formed by a single layer of film (an aluminum film or a silver film) or double layers of films (combination of an aluminum film and a silver film). Thereby thermal conductivity, heat dissipation area and heat dissipation effect are improved and the design is suitable for high-power LED chip and the package thereof.

Refer to FIG. 4A~4D, a method for manufacturing flip-chip LED of the present invention further includes a step 5 after the four steps mentioned above.

Step 5-1: use the same mask to form a pattern of a conductive reflective layer 130 on each LED chip 1 having a multi-layer reflective layer 80 produced by the above step 4, as shown in FIG. 4A. The conductive reflective layer 130 is electrically conductive so that there is no need to arrange the photoresist layer 90 on the exposed electrodes with different polarities 60, 70. The pattern of the conductive reflective layer 130 is disposed with a preset position of an electrode division area 131. As shown in FIG. 4B, a photoresist layer 92 is formed at the preset position on surface of the produced multi-layer reflective layer 80.

Step 5-2: form a conductive reflective layer 130 on surface of the produced multi-layer reflective layer 80 by PVD at one time, as shown in FIG. 4C. The one-time manufacturing means using a pumping and a venting process once to complete manufacturing of the conductive reflective layer 130. The conductive reflective layer 130 is a metal reflective layer formed by a single layer of film (an aluminum film or a silver film) or double layers of film (combination of an aluminum film and a silver film).

Step 5-3: remove the photoresist layer 92 to form an electrode division area 131 on the conductive reflective layer 130, as shown in FIG. 4D. Thus manufacturing of a plurality of LED chips 3 having the multi-layer reflective layer 80 and the conductive reflective layer 130 on the wafer 2 has been completed.

Refer to FIG. 2A~2D, the method for manufacturing flip-chip GaN LED mentioned above further includes following steps after the step 4.

Figure 2A:
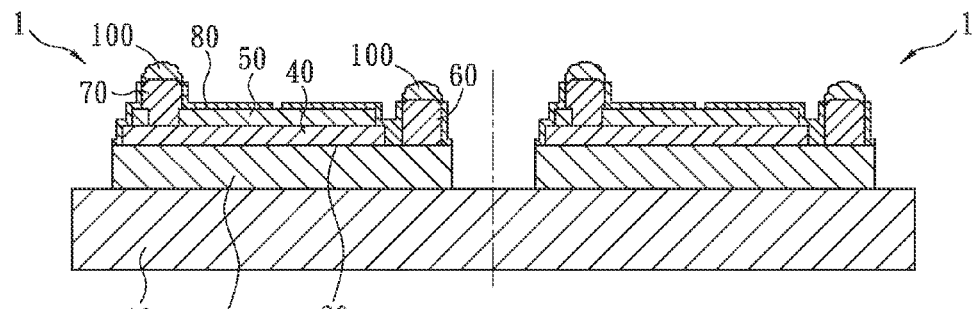
FIG. 2A~2D are schematic drawings showing a flow chart for packaging flip-chip LED chips and structure of the LED package according to the present invention.

Step 6: arrange a solder bumping 100 at surface of each exposed electrode-the negative electrode 60 and the positive electrode 70, as shown in FIG. 2A.

Figure 2B:
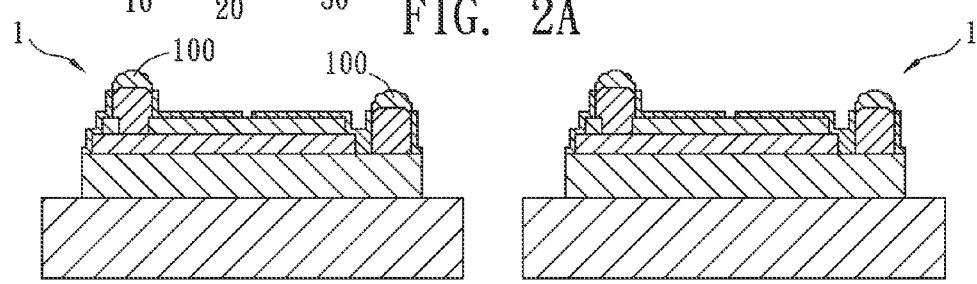

Step 7: get separate LED chips 1 by polishing, laser scribing and breaking, and chip sorting (or photoelectric property testing of chip), as shown in FIG. 2B.

Figure 2C:
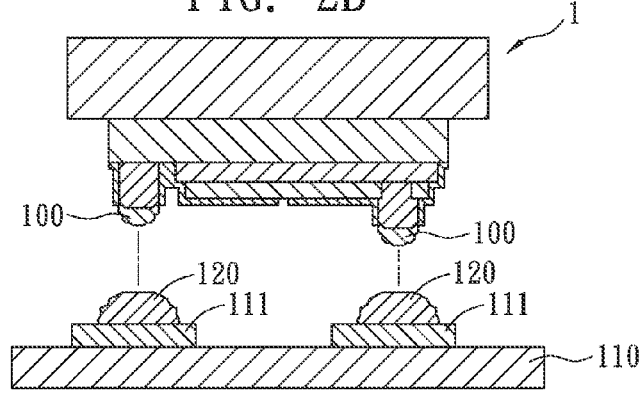
Figure 2D:
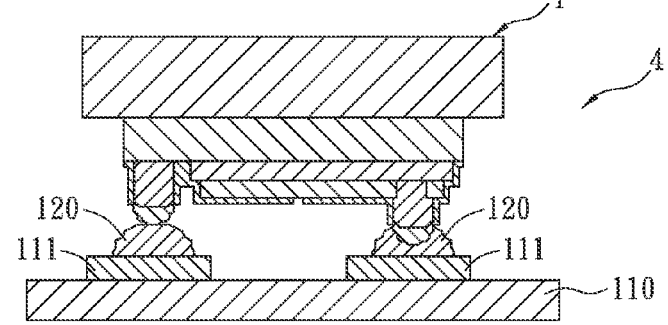

Step 8: align and mount the separate LED chip 1 to corresponding contacts 111 on a LED heat spreader 110 with conductive adhesive 120 (such as flux or solder paste) in an upside-down manner by die bonding and reflow soldering to complete LED package 4 of the LED 1, as shown in FIG. 2C and FIG. 2D.

Figure 3A:
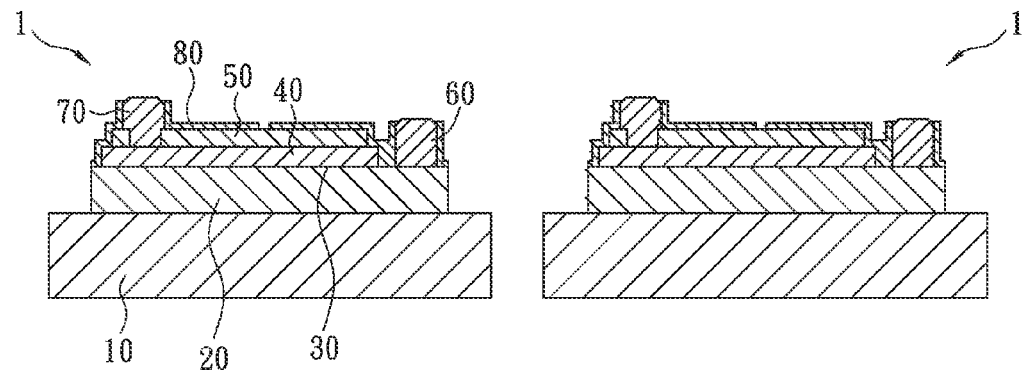
FIG. 3A~3C are schematic drawings showing another flow chart for packaging flip-chip LED chips and structure of the LED package according to the present invention.
Figure 3B:
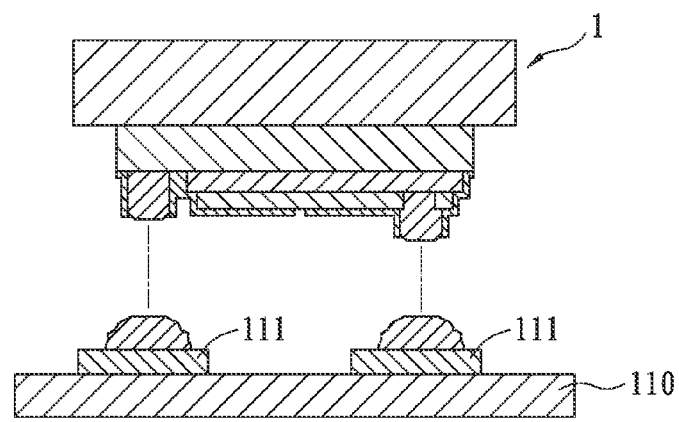
Figure 3C:
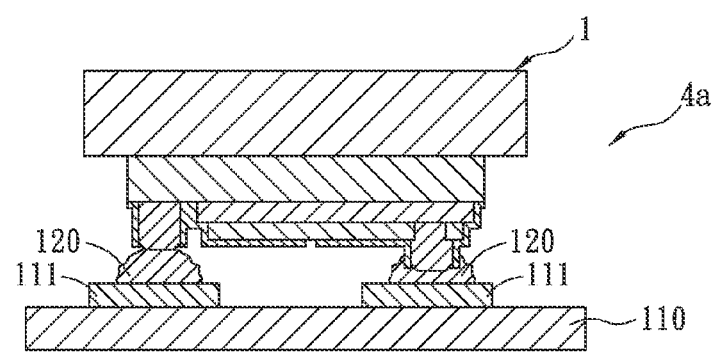

Refer to FIG. 3A~3C, a method for packaging flip-chip LEDs manufactured by the steps 1~4 mentioned above includes following steps after the above step 4.

Step 6a: refer to FIG. 3A, divide a wafer having a plurality of LED chips 1 shown in FIG. 1D into separate LED chips 1 by polishing, laser scribing and breaking, and chip sorting (or photoelectric property testing of chip).

Step 7a: refer to FIG. 3B and FIG. 3C, align and mount the separate LED chip 1 to corresponding contacts 111 on a LED heat spreader 110 with conductive adhesive 120 (such as flux or solder paste) in an upside-down manner by die bonding and reflow soldering to complete LED package 4a.

Compared the flow chart shown in FIG. 3A~3C with the flow chart shown in FIG. 2A~2D, the flow chart in FIG. 3A~3C doesn't includes the step 6 shown in FIG. 2A~2D.

Figure 5A:
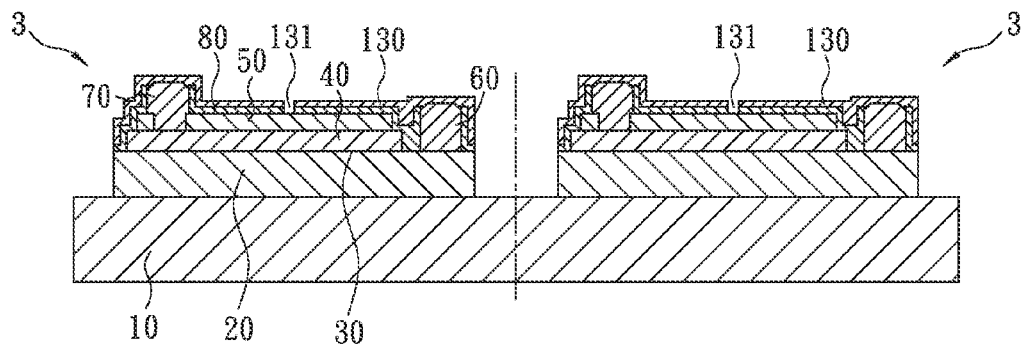
FIG. 5A~5D are schematic drawings showing a further flow chart for packaging flip-chip LED chips and structure of the LED package according to the present invention.
Figure 5B:
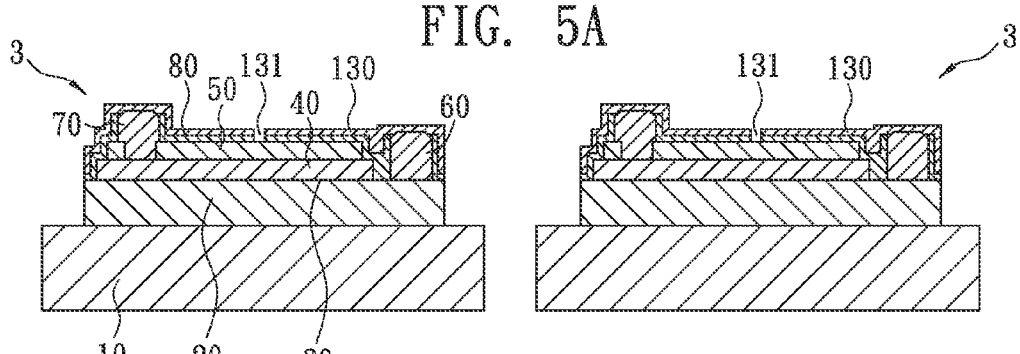
Figure 5C:
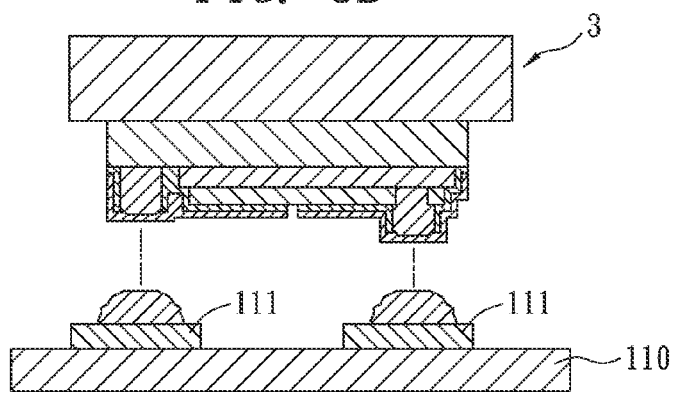
Figure 5D:
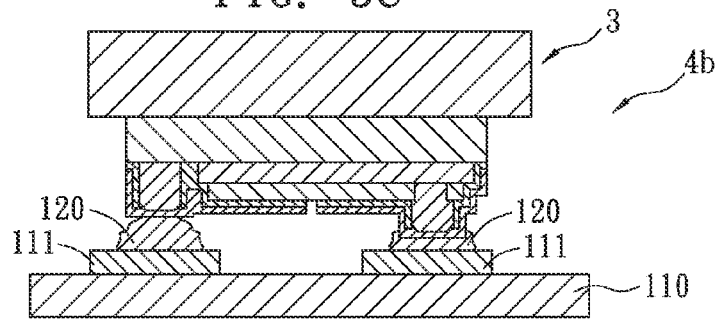

Refer to FIG. 5A~5C, a method for packaging flip-chip LEDs manufactured by the steps 1~5 (including steps 5-1~5-3) mentioned above includes following steps after the step 5.

Step 6b: refer to FIG. 5A and FIG. 5B, divide a wafer 2 having a plurality of LED chips 3 shown in FIG. 4D into separate LED chips 3 by polishing, laser scribing and breaking, and chip sorting (or photoelectric property testing of chip).

Step 7b: refer to FIG. 5B and FIG. 5C, align and mount the separate LED chip 3 to corresponding contacts 111 on a LED heat spreader 110 with conductive adhesive 120 (such as flux or solder paste) in an upside-down manner by die bonding and reflow soldering to complete LED package 4b.

In addition, while producing the multi-layer reflective layer or the conductive reflective layer 130, the present invention uses the same mask to form the pattern of the reflective layer 80/130 and the then a pumping and venting process is performed once to complete vacuum deposition of each layer of the reflective layer. The mask used for manufacturing the multi-layer reflective layer 80 and the mask used for manufacturing the conductive reflective layer 130 can be either the same or different 'from each other. Yet the different masks are preferred. The different masks form different patterns. Thus the two photoresist layers 91, 92 formed by the masks are at different positions Thereby the position of the electrode division area 81 in the multi-layer reflective layer 80 and the position of the electrode division area 131 in the conductive reflective layer 130 are located in a staggered pattern vertically. The electrode division area 81, 131 is mainly used to make the two electrodes electrically insulated from each other. Thus the minimum the area of the electrode division area 81/131 is, the less the reflection effect of the reflective layer 80/130 is affected. Thus the staggered pattern of the electrode division area 81/131 is beneficial to the reflection effect of the assembly of the multi-layer reflective layer 80 and the conductive reflective layer 130 staggered from each other.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A flip-chip LED comprising:
a sapphire substrate;
an N-type ohmic contact layer formed and disposed on the substrate;
a P-type ohmic contact layer formed and arranged at the N-type ohmic contact layer; a light emitting layer formed at an interface between the N-type ohmic contact layer and the P-type ohmic contact layer;
a transparent conductive metal oxide layer formed and set on the P-type ohmic contact layer;
two exposed electrodes with different polarities including a negative electrode and a positive electrode; and
a multi-layer reflective layer covered over an outermost layer thereof;
wherein the multi-layer reflective layer is manufactured by Physical Vapor Deposition (PVD) with a mask at one time to form each layer of the multi-layer reflective layer in turn on an outer surface of the flip-chip LED except the outer surface disposed with the exposed electrodes;
wherein the mask is used to form a pattern of the multi-layer reflective layer so that a photoresist layer is disposed on surface of each of the two exposed electrodes with different polarities; then a pumping and venting process is used only once to form each layer of the multi-layer reflective layer in turn, and
wherein the multi-layer reflective layer is formed by a non-conductive silicon dioxide (SiO2) film, a conductive aluminum film and a non-conductive silicon dioxide (SiO2) film; the conductive aluminum film is formed between the two non-conductive silicon dioxide (SiO2) films.

2. The flip-chip LED as claimed in claim 1, wherein the multi-layer reflective layer is disposed with an electrode division area by which the multi-layer reflective layer is divided into two separate half reflective layers that are electrically insulated from each other and electrically connected the two exposed electrodes with different polarities respectively.

3. The flip-chip LED as claimed in claim 1, wherein the multi-layer reflective layer is formed by non-conductive distributed Bragg reflector (DBR).

4. The flip-chip LED as claimed in claim 1, wherein a conductive reflective layer is disposed over the multi-layer reflective layer; the conductive reflective layer is formed on an outer surface of the multi-layer reflective layer by physical vapor deposition (PVD) with the same mask at one time.

5. The flip-chip LED as claimed in claim 4, wherein the conductive reflective layer is a metal reflective layer formed by an aluminum film, a silver film or combinations of the aluminum film with the silver film.

6. A flip-chip LED package comprising:
a flip-chip LED chip; and
a heat spreader;
wherein the LED chip includes a sapphire substrate, an N-type ohmic contact layer, a light emitting layer, a P-type ohmic contact layer, a transparent conductive metal oxide layer, two exposed electrodes with different polarities, and a multi-layer reflective layer covered over the outermost layer thereof;
wherein the multi-layer reflective layer is manufactured by Physical Vapor Deposition (PVD) with a mask at one time and is formed on an outer surface of the flip-chip LED except the outer surface disposed with the exposed electrodes;
wherein the mask is used to form a pattern of the multi-layer reflective layer so that a photoresist layer is disposed on surface of each of the two exposed electrodes with different polarities; then a pumping and venting process is used only once to form each layer of the multi-layer reflective layer in turn;
wherein the LED chip is aligned and mounted to contacts on the heat spreader with conductive adhesive in an upside-down manner by die bonding and reflow soldering, and
wherein the multi-layer reflective layer is formed by a non-conductive silicon dioxide (SiO2) film, a conductive aluminum film and a non-conductive silicon dioxide (SiO2) film; the conductive aluminum film is formed between the two non-conductive silicon dioxide (SiO2) films.

7. The flip-chip LED package as claimed in claim 6, wherein a conductive reflective layer is disposed over the multi-layer reflective layer; the conductive reflective layer is formed on an outer surface of the multi-layer reflective layer by physical vapor deposition (PVD) with the same mask at one time.

8. The flip-chip LED package as claimed in claim 7, wherein the conductive reflective layer is a metal reflective layer formed by an aluminum film, a silver film or combinations of the aluminum film with the silver film.

* * * * *